US008656736B2

(12) United States Patent
Terao

(10) Patent No.: US 8,656,736 B2
(45) Date of Patent: *Feb. 25, 2014

(54) METHOD OF MANUFACTURING GLASS SUBSTRATE AND METHOD OF MANUFACTURING ELECTRONIC COMPONENTS

(75) Inventor: Eiji Terao, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/135,496

(22) Filed: Jul. 7, 2011

(65) Prior Publication Data

US 2012/0006060 A1    Jan. 12, 2012

(30) Foreign Application Priority Data

Jul. 8, 2010    (JP) .................................. 2010-156173

(51) Int. Cl.
*C03C 27/02*    (2006.01)

(52) U.S. Cl.
USPC .......................................................... 65/59.1

(58) Field of Classification Search
USPC .................... 257/629–652, 794; 65/138–140, 65/145–149, 155, 59.1, 59.31, 59.6; 428/34.5, 630
See application file for complete search history.

(56) References Cited

U.S. PATENT DOCUMENTS

| | | | | | |
|---|---|---|---|---|---|
| 2,219,574 | A | * | 10/1940 | Fraenckel | 220/2.3 A |
| 2,287,598 | A | * | 6/1942 | Brown | 65/59.1 |
| 3,193,907 | A | * | 7/1965 | Fyler | 445/36 |
| 3,305,334 | A | * | 2/1967 | Fyler | 65/42 |
| 3,999,004 | A | * | 12/1976 | Chirino et al. | 174/257 |
| 4,209,481 | A | * | 6/1980 | Kashiro et al. | 264/437 |
| 4,717,433 | A | * | 1/1988 | Weisert et al. | 148/710 |
| 5,272,283 | A | * | 12/1993 | Kuzma | 174/262 |
| 5,364,276 | A | * | 11/1994 | Inasaka | 439/66 |
| 5,515,604 | A | * | 5/1996 | Horine et al. | 29/830 |
| 5,702,807 | A | * | 12/1997 | Horiuchi et al. | 428/210 |

(Continued)

FOREIGN PATENT DOCUMENTS

| | | | | | |
|---|---|---|---|---|---|
| JP | 07267664 | A | * | 10/1995 | C03B 25/02 |
| JP | 10190190 | | | 7/1998 | |

(Continued)

OTHER PUBLICATIONS

EPO Search Report mailed Jun. 3, 2013 issued in EPC Appln. No. EP 11 17 3348.

*Primary Examiner* — Joseph S. Del Sole
*Assistant Examiner* — Erin Snelting
(74) *Attorney, Agent, or Firm* — Adams & Wilks

(57) ABSTRACT

A method of manufacturing a glass substrate with buried through electrodes comprises forming via-holes in each of two base panels and in a glass panel interposed between the base panels so that the via-holes are aligned with one another. Conductive wires are penetrated through the aligned via-holes and stretched between the base panels. The first panel is subjected to compression stress and is heated to a temperature higher than a softening point of the glass material so that the stretched conductive wires are buried in the glass material. The first panel is then cooled to form a glass ingot having the buried conductive wires. The glass ingot is sliced to form a glass panel, and the glass panel is polished to expose the buried conductive wires on front and rear surfaces of the glass panel to form a glass substrate with buried through electrodes.

20 Claims, 15 Drawing Sheets

(56) References Cited

U.S. PATENT DOCUMENTS

| | | | | |
|---|---|---|---|---|
| 5,733,640 | A * | 3/1998 | Horiuchi et al. | 428/210 |
| 5,817,984 | A * | 10/1998 | Taylor et al. | 174/152 GM |
| 5,904,770 | A * | 5/1999 | Ohtani et al. | 117/103 |
| 5,989,470 | A * | 11/1999 | Doan et al. | 264/261 |
| 5,997,999 | A * | 12/1999 | Horiuchi et al. | 428/210 |
| 6,014,873 | A * | 1/2000 | Hirotsu et al. | 65/104 |
| 6,043,468 | A * | 3/2000 | Toya et al. | 219/544 |
| 6,174,175 | B1 * | 1/2001 | Behfar et al. | 439/91 |
| 6,329,631 | B1 * | 12/2001 | Yueh | 219/121.65 |
| 6,821,625 | B2 * | 11/2004 | Chu et al. | 428/408 |
| 7,375,887 | B2 * | 5/2008 | Hansen et al. | 359/485.05 |
| 7,400,159 | B2 * | 7/2008 | Wang et al. | 324/750.16 |
| 7,459,112 | B2 * | 12/2008 | Chu et al. | 264/160 |
| 7,585,548 | B2 * | 9/2009 | Wang et al. | 427/256 |
| 7,652,492 | B2 * | 1/2010 | Wang et al. | 324/756.03 |
| 7,912,333 | B2 * | 3/2011 | Varkey et al. | 385/101 |
| 7,913,387 | B2 * | 3/2011 | Chu et al. | 29/890.04 |
| 7,918,025 | B2 * | 4/2011 | Chu et al. | 29/890.04 |
| 7,989,080 | B2 * | 8/2011 | Greenberg et al. | 428/472.2 |
| 8,004,480 | B2 * | 8/2011 | Kim et al. | 345/82 |
| 8,053,025 | B2 * | 11/2011 | Lin et al. | 427/74 |
| 8,163,397 | B2 * | 4/2012 | Ok et al. | 428/472.2 |
| 2003/0129654 | A1 * | 7/2003 | Ravkin et al. | 435/7.1 |
| 2005/0110162 | A1 | 5/2005 | Meyer-Berg et al. | 257/778 |
| 2006/0283084 | A1 * | 12/2006 | Johnson | 49/1 |
| 2007/0289768 | A1 * | 12/2007 | Moore et al. | 174/98 |
| 2009/0038153 | A1 * | 2/2009 | Chu et al. | 29/890.03 |
| 2009/0085431 | A1 | 4/2009 | Ono et al. | 310/314 |
| 2009/0197040 | A1 * | 8/2009 | Hanada et al. | 428/131 |
| 2012/0006060 | A1 * | 1/2012 | Terao | 65/41 |
| 2012/0006061 | A1 * | 1/2012 | Terao | 65/41 |
| 2012/0138977 | A1 * | 6/2012 | Li | 257/89 |

FOREIGN PATENT DOCUMENTS

| | | |
|---|---|---|
| JP | 2001160678 | 6/2001 |
| JP | 2002121037 | 4/2002 |
| JP | 2002124845 | 4/2002 |
| JP | 2003209198 | 7/2003 |

* cited by examiner

GLASS PREPARATION PROCESS

RECESS FORMATION PROCESS
(PRESS-MOLDING)

RECESS FORMATION PROCESS
(EXTRACTION)

GRINDING PROCESS

PERSPECTIVE VIEW OF WAFER

METHOD OF MANUFACTURING GLASS SUBSTRATE AND METHOD OF MANUFACTURING ELECTRONIC COMPONENTS

BACKGROUND OF THE INVENTION

1. Field of the Invention

The invention relates to a method of manufacturing a glass substrate having a plurality of through electrodes and a method of manufacturing electronic components using the same.

2. Background Art

In recent years, piezoelectric vibrators using crystals or the like have been used in a clock source or a timing source of mobile phones or mobile information devices. Various piezoelectric vibrators are known in the art, and a surface-mounted type piezoelectric vibrator is known as one. In addition, a three-layered structure as the piezoelectric vibrator is known in the art, in which a piezoelectric substrate, where a piezoelectric vibrating reed is formed, is vertically interposed and bonded between a base substrate and a lid substrate. The piezoelectric vibrating reed is housed in a cavity formed between the base substrate and the lid substrate.

Furthermore, recently, a two-layered structure piezoelectric vibrator has been developed. This type is formed from a two-layered structure package obtained by directly bonding the base substrate and the lid substrate, and the piezoelectric vibrating reed is housed in the cavity between the base substrate and the lid substrate. The two-layered structure piezoelectric element is advantageous in that it can allow for a lower profile compared to the three-layered structure.

JP-A-2002-124845 and JP-A-2002-121037 disclose a two-layered structure crystal vibrator package, in which a glass material is used as a package material for the base substrate or the lid substrate. The glass material facilitates shaping and reduces manufacturing costs compared to ceramics. In addition, since the glass material has low thermal conductivity, it provides an excellent thermal insulation property, so as to protect an internal piezoelectric vibrator from temperature variation.

JP-A-2003-209198 discloses another two-layered structure crystal vibrator package similar to the aforementioned one. In this case, a glass material is also used in the base substrate, and a method of forming through electrodes using a metal material in the base substrate is disclosed. When the through electrodes are formed in the glass material, first, via-holes are formed in the glass panel. FIGS. 17A and 17B illustrate a method of forming through electrodes including a metal pin 115 in the glass panel 131 (FIG. 3 of JP-A-2003-209198). FIG. 17A illustrates a method of forming a via-hole 119 in the glass panel 131. The glass panel 131 is provided at the bottom of the die 126. The die 126 is provided with a heater 125 so as to heat the glass panel 131. In the upper portion of the die 126, a punch press including a punch 129 is provided. In the glass panel 131 side of the punch 129, perforating pins 128 are provided, and the heater 127 is also provided in the punch 129. In addition, after heating the glass panel 131 to a predetermined temperature, the punch 129 is pressed down to form the via-hole 119.

FIG. 17B illustrates a method of implanting a metal pin 115 in the via-hole 119 of the glass panel 131. The glass panel 131 where the via-hole 119 has been formed is installed in the die 135, and the glass frit 132 is blown into the via-hole 119 using a glass frit blower 133. Then, the metal pin 115 is implanted into the via-hole 119 using a metal pin punch 134.

FIGS. 18A and 18B illustrate a press-molding process (FIG. 4 of JP-A-2003-209198). As shown in FIG. 18A, the glass panel 131 having the metal pin 115 implanted into the via-hole 119 is installed between the lower press template 136 and the upper press template 137. The upper press template 137 is provided with a partitioning convex ridge 138, a pin head hosting recess 139, or a recess-forming convex ridge 141. These templates are placed into an electric furnace and heated to a temperature of 1000° C. or higher while the upper and lower press templates 137 and 136 are pressed to each other. As a result, as shown in FIG. 18B, the engraving on the surface of the upper press template 137 is transferred to the glass panel 131 so that a partitioning trench 142 or a recess 116 is formed in the glass panel 131. At the same time, through electrodes including the metal pin 115 having a hermetical sealing property are formed in the glass panel 131.

However, if the glass panel 131 is heated, the via-hole 119 is formed, and then, the glass panel 131 is cooled, the glass panel 131 is distorted due to internal stress, and the flatness of the glass panel 131 is degraded. In addition, if the cooling is performed after the surface engraving of the upper press template 137 is transferred to the glass panel 131, some problems may occur. For example, the metal pin 115 may be slanted, or positioning of the metal pin 115 may be deviated due to flow of glass during the transfer or irregular heat distribution during the cooling. In addition, the glass panel 131 may be complexly distorted due to internal stress. If the bending is to be corrected through grinding, the amount of grinding may become significant, and much time may be necessary in the fabrication. In addition, the number of parts having a predetermined shape may be reduced. Furthermore, the metal pin 115 exposed on the bottom of the recess 116 is slanted, so that the positions of the through electrodes may be deviated. If the flatness of the top surface of the side wall surrounding the recess 116 is not excellent, the hermetical sealing property of the lid joining with the top surface may not be guaranteed. This may reduce reliability of an electronic component.

SUMMARY OF THE INVENTION

The invention has been made to address the aforementioned problems, and provides a glass substrate having excellent flatness with through electrodes provided with a high positioning precision.

According to an aspect of the invention, there is provided a method of manufacturing a glass substrate with through electrodes, the method including: a glass via-hole formation process in which a plurality of via-holes are formed in panel-shaped glass; a base via-hole formation process in which a plurality of via-holes are formed in two bases; a wire stretching process in which the panel-shaped glass is interposed between the two bases, positions of a plurality of the via-holes of the bases and a plurality of the via-holes of the panel-shaped glass are aligned, conductive wires are penetrated through a plurality of the via-holes, and the wires between the two bases are stretched; a wire burying process in which the panel-shaped glass is heated to a temperature higher than a softening point of the glass, and the wires between the bases are buried by the glass; an ingot formation process in which a glass ingot having the buried wires is formed by cooling the glass; a slicing process in which a glass panel is formed by slicing the ingot; and a polishing process in which a plurality of the wires are exposed on front and rear surfaces by polishing the glass panel to provide the through electrode.

In addition, it is preferable that the glass via-hole formation process includes a recess formation process in which a recess is formed in the panel-shaped glass, and a grinding process in which the recess is penetrated to a rear surface side by grinding the rear surface opposite to a front surface where the recess is formed.

In addition, it is preferable that the wire burying process is a process of applying compression stress to the panel-shaped glass.

In addition, it is preferable that, in the wire stretching process, a plurality of the wires are stretched between two bases by penetrating a plurality of the wires through a single via-hole of the panel-shaped glass such that a plurality of the via-holes formed in the bases are matched with a single via-hole formed in the panel-shaped glass.

In addition, it is preferable that, in the ingot formation process, a cooling rate from a temperature 50° C. higher than the distortion point of the glass substrate to a temperature 50° C. lower than the distortion point thereof is configured to be slower than a cooling rate to a temperature 50° C. higher than the distortion point thereof.

In addition, it is preferable that a thermal expansion coefficient of the wire is substantially equal to that of the glass.

According to another aspect of the invention, there is provided a method of manufacturing an electronic component, the method including: a base substrate formation process in which the glass substrate is formed based on any one of the methods of manufacturing the glass substrate described above, and an electrode is formed in the glass substrate to provide a base substrate; a mounting process in which an electronic component is mounted on the base substrate; and a bonding process in which a lid substrate is bonded to the base substrate having the mounted electronic component.

The method of manufacturing a glass substrate according to the invention includes: a glass via-hole formation process in which a plurality of via-holes are formed in panel-shaped glass; a base via-hole formation process in which a plurality of via-holes are formed in two bases; a wire stretching process in which the panel-shaped glass is interposed between the two bases, positions of the via-holes of the bases and the via-holes of the panel-shaped glass are aligned, wires made of a conductive material are penetrated through a plurality of the via-holes, and the wires between the two bases are stretched; a wire burying process in which the panel-shaped glass is heated to a temperature higher than a softening point of the glass, and the wires between the bases are buried by the glass; an ingot formation process in which the glass is cooled to form a glass ingot having the buried wires; a slicing process in which the ingot is sliced to form a glass panel; and a polishing process in which the glass panel is polished to expose the wires on front and rear surfaces as the through electrodes. As a result, since the pressure applied to the wires by floating of the glass is insignificant, the positions of the wires can be controlled with a high precision. Since the glass ingot is sliced after cooling, it is possible to form a glass substrate with through electrodes with a high hermetical sealing property without bending.

DETAILED DESCRIPTION OF THE INVENTION

Figure 1:
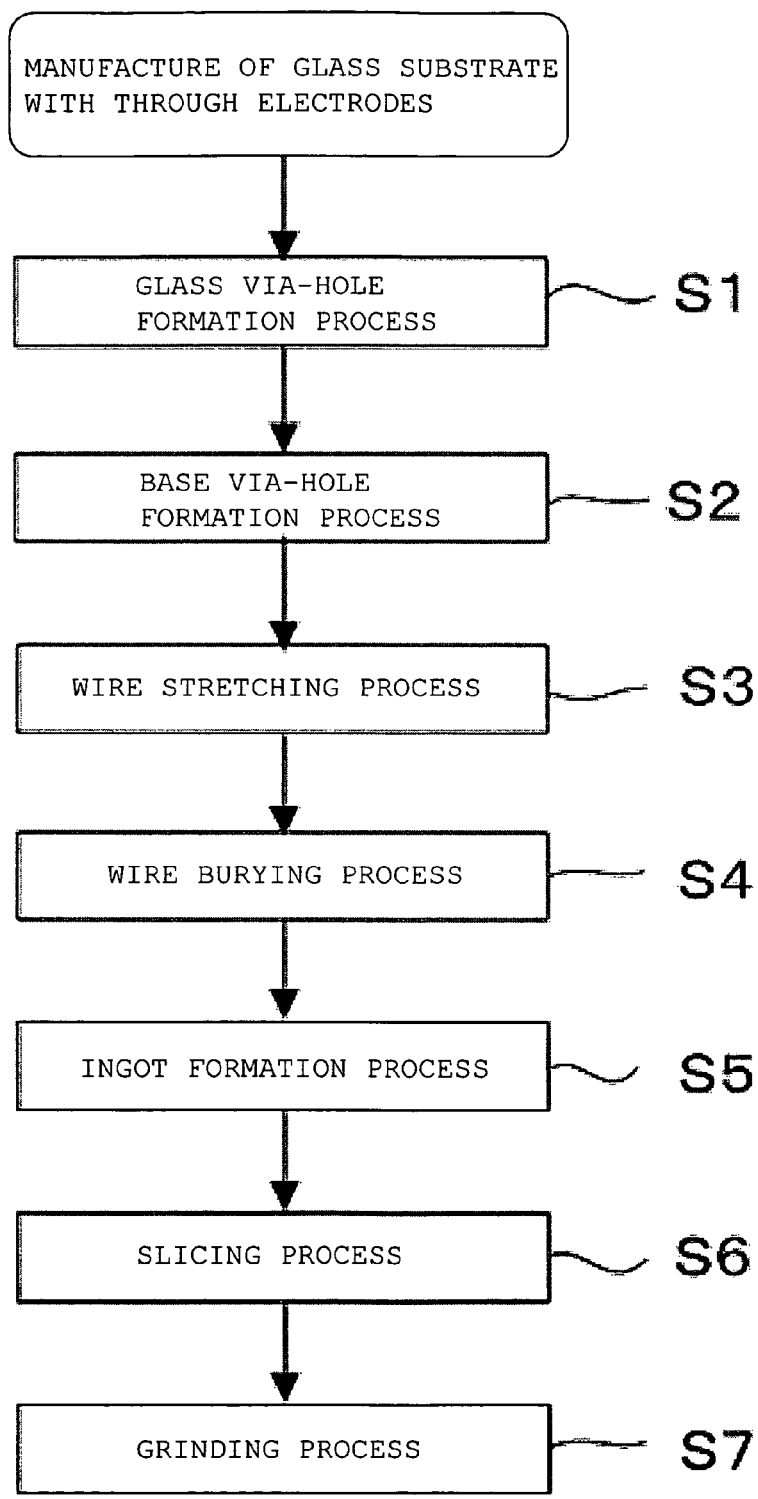
FIG. 1 is a flowchart illustrating a method of manufacturing a glass substrate according to an embodiment of the invention.

FIG. 1 is a flowchart illustrating a method of manufacturing a glass substrate with through electrodes according to an embodiment of the invention as a basic configuration of the invention. First, in a glass via-hole formation process S1, a plurality of via-holes are formed in panel-shaped glass. In addition, in a base via-hole formation process S2, a plurality of via-holes formed in two bases. The glass may include soda-lime glass, borosilicate glass, lead glass, or the like. As a material of the base, a heat-resistant material such as carbon or a ceramic is used. The via-holes may be formed by performing cutting, sand-blasting, press-molding, or the like of the glass. In addition, the via-hole may be formed by cutting the base, performing press-molding for a green sheet, and baking it.

Then, in a wire stretching process S3, the panel-shaped glass having the via-holes is interposed between two bases having the via-holes, and positions of the via-holes are aligned between the base and the panel-shaped glass. In addition, conductive wires are penetrated through the via-holes, and the wires are stretched between the two bases. For example, a jig is provided in one end of the wire, and the jig is secured in one base. The other end of the wire is provided with a securing section, and the securing section is secured in the other base. Then, the wires can be tensioned by applying stress to separate the bases away from each other. The wires may be formed of Ni—Fe alloy, for example, 42 alloy or Kovar. If such alloy is used, the thermal expansion coefficient can be approximated to that of glass, so that degradation in a surface between glass and wires with respect to a thermal variation can be reduced.

Then, in a wire burying process S4, the panel-shaped glass is heated to a temperature higher than the softening point and allowed to flow so that the wires between bases are buried by glass. In the case where a plurality of panel-shaped glass pieces are stacked between the bases, the panel-shaped glass pieces are fused and bonded to each other. In this case, for example, the glass is heated to a temperature equal to or higher than 900° C. Then, in an ingot formation process S5, the glass is cooled so that a glass ingot having the buried wires is formed. Then, in a slicing process S6, the glass ingot is cut into round slices using a slicer such as a wire saw. Then, in a grinding process S7, both surfaces of the sliced glass panel are ground and polished to expose the cross sections of the wires on both surfaces of the glass panel so that a glass substrate with through electrodes is obtained.

In this manner, since the glass is softened and allowed to flow while the wires are penetrated through the via-holes of the panel-shaped glass which is provided with the via-holes, it is possible to bury the wires in the glass within a short time. In addition, since the glass ingot is sliced after cooling, it is possible to obtain a glass substrate with through electrodes without bending. In addition, if the panel-shaped glass is made as multiple layers, it is possible to manufacture a large glass ingot within a short period of time and simultaneously form a plurality of glass substrates.

In addition, the glass via-hole formation process S1 may include a recess formation process in which a recess is formed in the panel-shaped glass, for example, using a molding-template and a grinding process in which the rear surface opposite to the surface where the recess has been formed is ground, and the recess is penetrated to the rear surface side. In this method, since it is possible to simultaneously form a plurality of via-holes, it is very appropriate for manufacturing of the glass substrate with through electrodes for multiple parts.

In addition, in a wire burying process S4, flowing of the softened glass can be expedited by applying compression stress to the panel-shaped glass. In addition, the wire burying process S4 may be performed in a vacuum. Particularly, in the case where multiple panel-shaped glass pieces are stacked between two substrates, it is possible to prevent foams from being absorbed in the inner side of the glass.

In addition, in the wire stretching process S3, it is possible to stretch a plurality of the wires to penetrate through a single via-hole of the panel-shaped glass by matching a plurality of via-holes formed in the bases with a single via-hole formed in the panel-shaped glass. As a result, it is possible to reduce the number of via-holes formed in the glass and facilitate positioning between the base and the panel-shaped glass or a wire penetration work.

In addition, in the ingot formation process S5, a cooling rate from a temperature 50° C. higher than the distortion point of the glass substrate to a temperature 50° C. lower than the distortion point thereof can be configured to be slower than a cooling rate to a temperature 50° C. higher than the distortion point thereof. As a result, distortion remaining in the glass substrate is reduced, it is possible to prevent a gap or a crack from being generated between the wire and the glass substrate, and it is possible to form the through electrodes with a high hermetical sealing property. In addition, if the thermal expansion coefficient of the wire is approximately equal to that of the glass, the remaining stress caused by a difference of thermal expansion is reduced so that it is possible to prevent a gap or a crack generated between the through electrode and the glass. Hereinafter, embodiments of the invention will be described in detail with reference to the accompanying drawings.

First Embodiment

Figure 2A:
FIGS. 2A to 2E illustrate a method of manufacturing a glass substrate according to an embodiment of the invention showing a glass via-hole formation process.
Figure 2B:
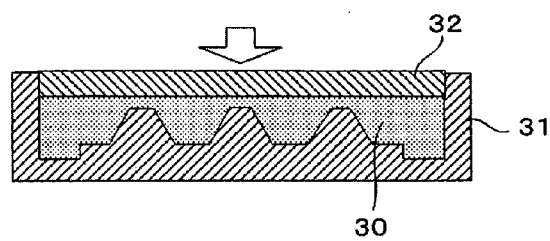
Figure 2C:
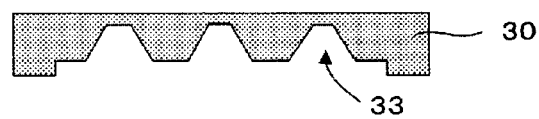
Figure 2D:
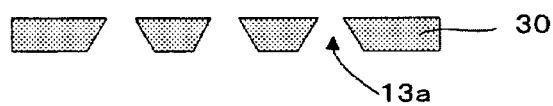
Figure 2E:
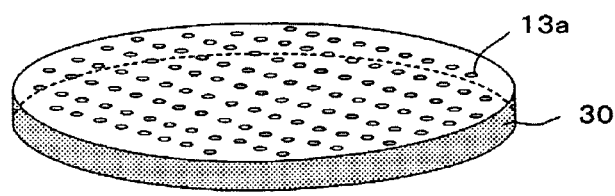
Figure 3:
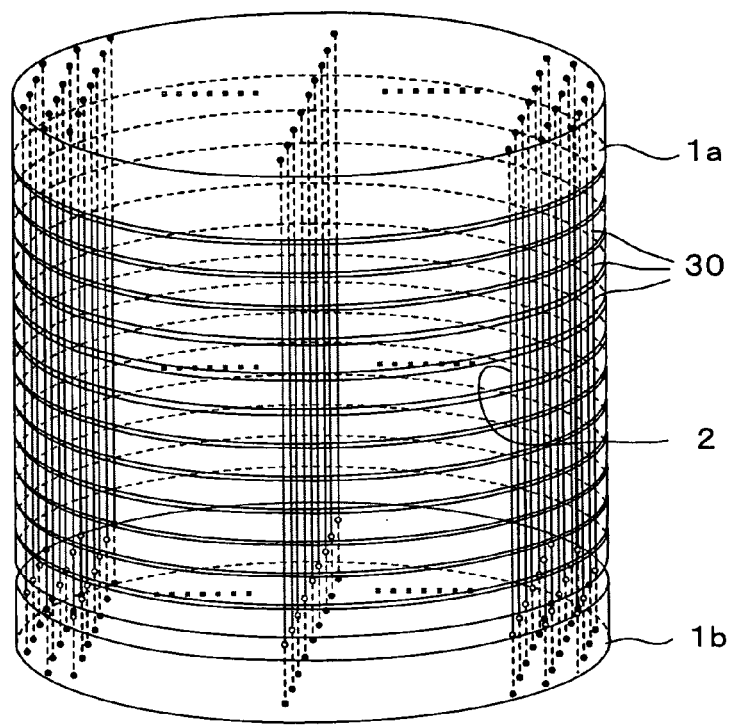
FIG. 3 illustrates a method of manufacturing a glass substrate according to an embodiment of the invention showing a condition in which panel-shaped glass is interposed between upper and lower bases, and wires are penetrated.
Figure 4:
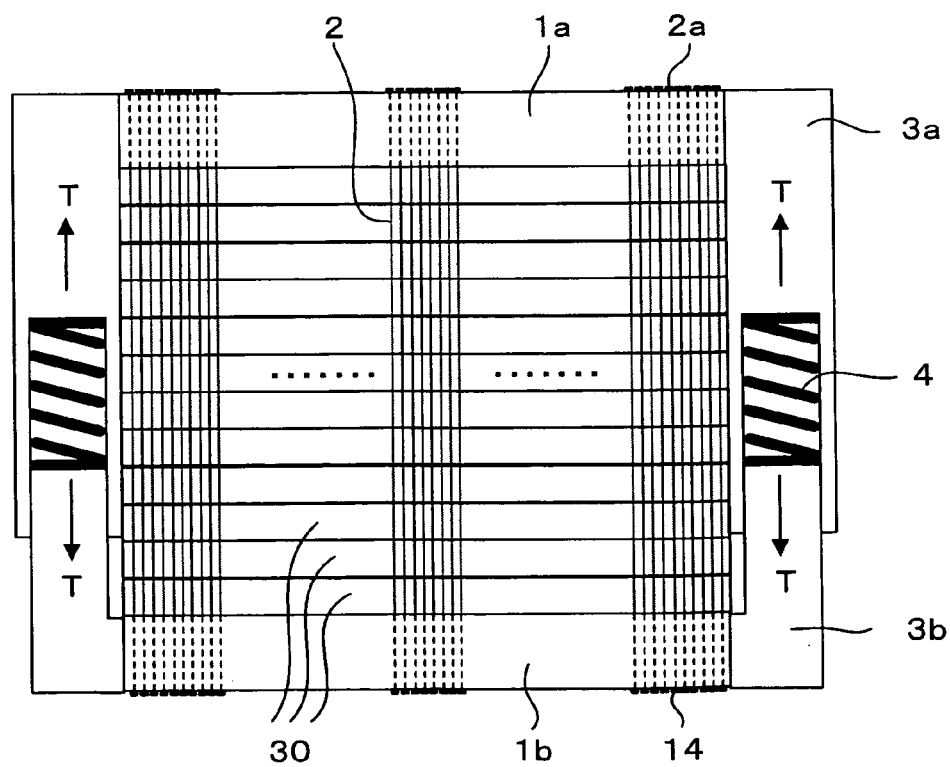
FIG. 4 illustrates a method of manufacturing a glass substrate according to an embodiment of the invention showing a condition in which the installed wires are tensioned.

FIGS. 2A to 7B are diagrams for illustrating a first embodiment of the invention. FIGS. 2A to 2E are explanatory diagrams illustrating an example of the glass via-hole formation process S1 in which a plurality of via-holes are formed in the panel-shaped glass. FIG. 3 illustrates a condition in which a plurality of panel-shaped glass pieces are stacked between upper and lower bases 1a and 1b, and wires 2 are installed in the via-holes. FIG. 4 illustrates a condition in which the installed wires 2 are tensioned. FIGS. 2 to 4 are provided to explain the wire stretching process S3.

First, in the glass via-hole formation process S1, via-holes for forming a plurality of through electrodes are punctured in the panel-shaped glass. As the glass, soda-lime glass is used. The via-holes may be formed through sand blasting or drilling. FIG. 2A to 2E illustrate a method of forming the via-holes using a molding-template. First, as shown in FIG. 2A, the panel-shaped glass 30 is prepared (glass preparation process). Then, as shown in FIG. 2B, a panel-shaped glass 30 is provided in a lower template 31, and an upper press-template 32 for pressurizing is placed on the panel-shaped glass 30 (recess formation process). The surface of the lower template 31 has a convex ridge for forming the via-hole. The convex ridge has a conical shape in which the side faces are inclined to improve a release property of glass. The panel-shaped glass 30 is heated to a temperature equal to or higher than the softening point thereof, and the upper template 32 is pressed down simultaneously. Here, the upper and lower templates 32 and 31 are made of a carbon material. The carbon material has an excellent release property for a glass material, and absorbs foams discharged from the glass material, so that it is possible to reduce porosity of voids remaining in the glass.

Next, after cooling, the panel-shaped glass 30 is extracted from the upper and lower templates 32 and 31 (recess formation process). As shown in FIG. 2C, the surface shape of the lower template 31 is transferred to the panel-shaped glass 30 so as to form a recess 33. Then, as shown in FIG. 2D, the rear surface opposite to the recess 33 is ground to form a via-hole 13a (grinding process). The vertical cross-section of the via-hole 13a has a conical shape. FIG. 2E is an exterior view illustrating a glass wafer made from the panel-shaped glass 30 having a plurality of via-holes 13a.

Then, in a base via-hole formation process S2, a plurality of via-holes are formed in the upper and lower bases 1a and 1b. A plurality of via-holes are formed in the same positions as those of the via-holes 13a formed in the panel-shaped glass 30. The upper and lower bases 1a and 1b are made of a carbon material. The upper and lower bases 1a and 1b have via-holes in the same positions as those of the via-holes 13a formed in the panel-shaped glass 30. As shown in FIG. 3, a plurality of panel-shaped glass pieces 30 are stacked and interposed between the upper and lower bases 1a and 1b, and the wires 2 made of a conductive material are penetrated. The wires 2 are secured on the top surface of the upper base 1a and the bottom surface of the lower base 1b.

As shown in FIG. 4, in the top surface of the upper base 1a, a plurality of wires 2 are secured in the upper base 1a using jigs 2a provided in one set ends of the wires 2, and, in the rear surface of the lower base 1b, also secured in the lower base 1b using securing sections 14 provided in the other ends of the wires 2. In addition, an upper tensioning member 3a and a lower tensioning member 3b are installed in both ends or four directions of the upper and lower bases 1a and 1b having a plurality of stretched wires 2, and stress T is applied to separate the upper and lower bases away from each other using a spring member 4. As a result, it is possible to tension a plurality of wires 2 between the upper and lower bases 1a and 1b. The upper and lower tensioning members 3a and 3b may be made of a carbon material or a ceramic material. The wires 2 maybe formed of Fe—Ni alloy, for example, 42 alloy or Kovar. If such an alloy is used, the thermal expansion coefficient can be approximated to that of glass, so that degradation in a surface between glass and wires with respect to thermal variation can be reduced. The wires 2 may have a diameter of 0.5 to 1 mm, and the shortest distance between the wires 2 may be set to 0.5 to 2 mm. The diameters of the upper and lower bases 1a and 1b are set to 1 to 4 inches. The upper and lower bases 1a and 1b are made of a carbon material. In addition, the upper and lower bases 1a and 1b may be rectangular or polygonal.

Figure 5:
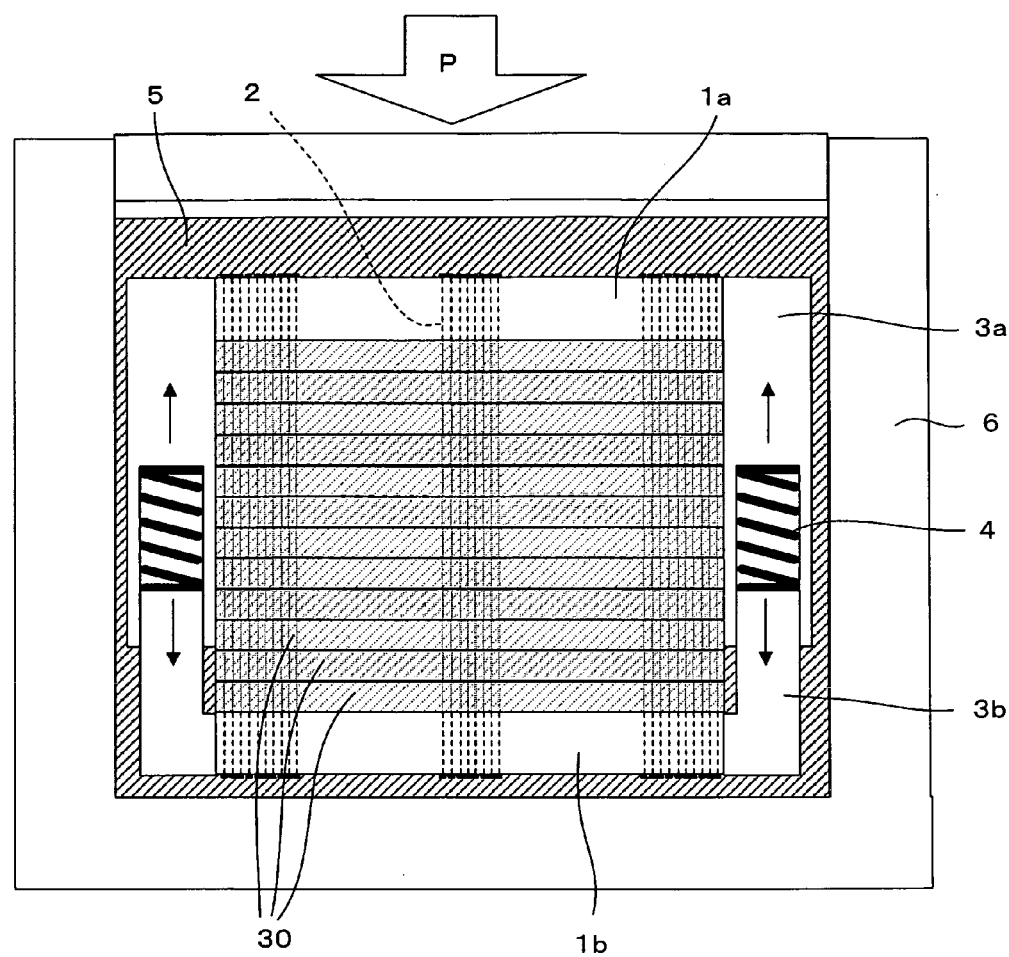
FIG. 5 illustrates a method of manufacturing a glass substrate according to an embodiment of the invention showing a condition in which a panel-shaped glass having the stretched wires is housed in a container.

FIG. 5 is an explanatory diagram of the wire burying process S4, which shows a condition in which the upper and lower bases 1a and 1b or the upper and lower tensioning members 3a and 3b are placed into a container 6. The wires 2, the upper and lower bases 1a and 1b, and the upper and lower tensioning members 3a and 3b are housed in the heat-resistant container 6. Then, the container 6 is heated to a temperature equal to or higher than the softening point of glass, for example, a temperature of 900° C. or higher to soften the glass and allow it to flow. The glass may bond a plurality of panel-shaped glass pieces 30, or the glass may be fused and bonded to the wires 2.

A glass 5 is further placed into the container 6 to fill the circumference of the upper and lower tensioning members 3a and 3b or the upper and lower bases 1a and 1b with the glass 5. Pressure P may be applied to a lid 7 to expedite flowing of the glass 5. In addition, instead of placing the glass 5 into the container 6, the container 6 maybe vacuumized so that it is possible to prevent air remaining between the panel-shaped glass 30 or in the via-holes 13a formed in the panel-shaped glass 30 from being absorbed in the glass. In addition, in FIG. 5, instead of using the heat-resistant container 6, the upper and lower bases may be used to form the heat-resistant container and a lid thereof, such that the panel-shaped glass 30 is interposed between the upper and lower bases, and a plurality of wires is stretched, and then, a heat treatment is performed. As a result, it is possible to reduce a consumption amount of the glass or the containers.

Figure 6:
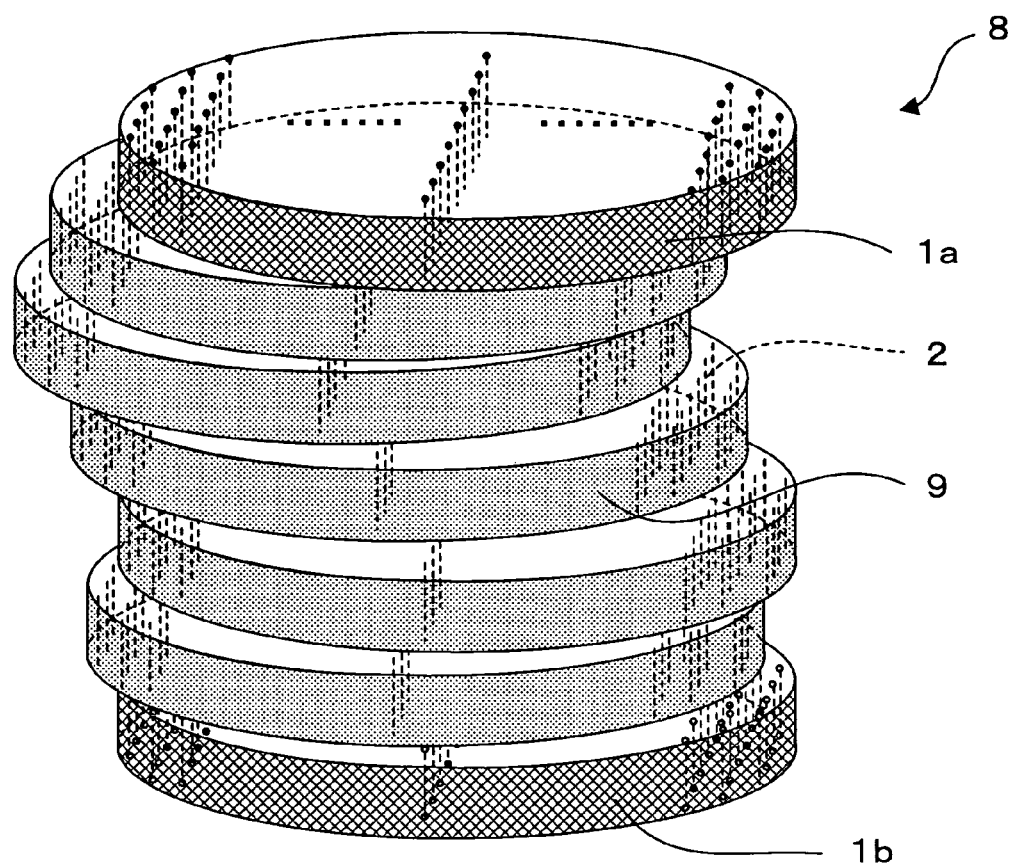
FIG. 6 illustrates a method of manufacturing a glass substrate according to an embodiment of the invention showing a condition in which a formed glass ingot is sliced.

FIG. 6 is a diagram showing an ingot formation process S5 and a slicing process S6. The container 6 and the glass 5 are cooled, and the upper and lower tensioning members 3a and 3b and the upper and lower bases 1a and 1b are extracted from the container 6. By removing the upper and lower tensioning members 3a and 3b, a glass ingot is obtained. In addition, the glass ingot 8 is cut into round slices using a dicing saw or a wire saw to obtain a glass panel 9. Since the glass ingot 8 is sliced after cooling, the glass panel 9 obtained after the slicing has little bending. Then, in the grinding process S7, both surfaces of the glass panel 9 are ground and polished so that a glass substrate 11 with buried through electrodes 10 is obtained. It is possible to form the glass substrate 11 having excellent flatness since the surface of the through electrode 10 and the surface of the glass material 5 are in parallel without a height difference.

In addition, in the ingot formation process S5, a cooling rate from a temperature 50° C. higher than the distortion point of the glass substrate to a temperature 50° C. lower than the distortion point thereof can be configured to be slower than a cooling rate to a temperature 50° C. higher than the distortion point thereof. As a result, distortion remaining in the glass substrate is reduced, it is possible to prevent a gap or a crack generated between the wire 2 and the glass panel 9, and to form through electrodes with a high hermetical sealing property.

Figure 7A:
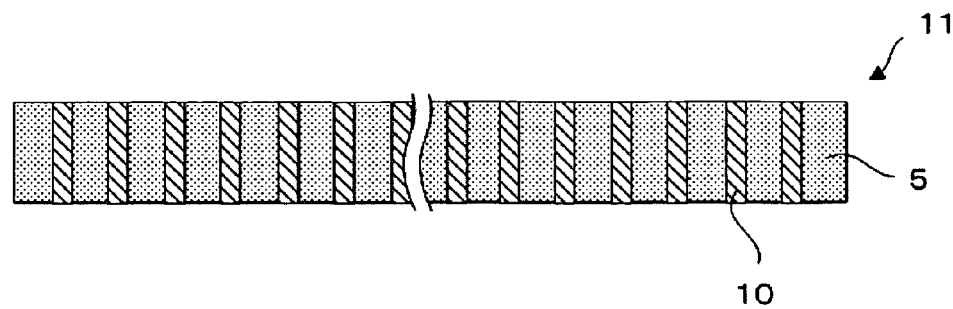
FIGS. 7A and 7B illustrate a method of manufacturing a glass substrate according to an embodiment of the invention showing a condition of the glass substrate.
Figure 7B:
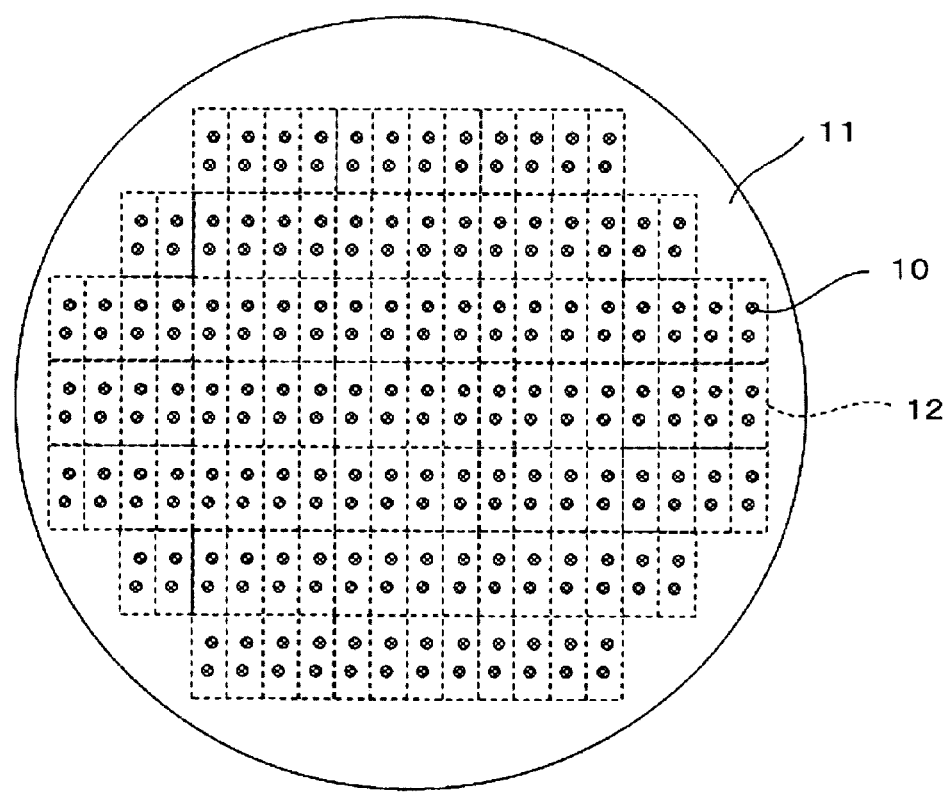

FIG. 7A is a schematic vertically cross-sectional view illustrating the glass substrate 11, and FIG. 7B is a schematic top view illustrating the glass substrate 11. Since the through electrodes 10 and the glass 5 are fused and bonded, a high hermetical sealing property is provided. Since the bending of the surface of the glass substrate 11 is insignificant, it is possible to perform grinding and polishing within a short period of time, and the grinding amount of the glass is also insignificant. As shown in FIG. 7B, a plurality of unit cells partitioned by a cutting line 12 are formed simultaneously with the two through electrodes 10.

Figure 8:
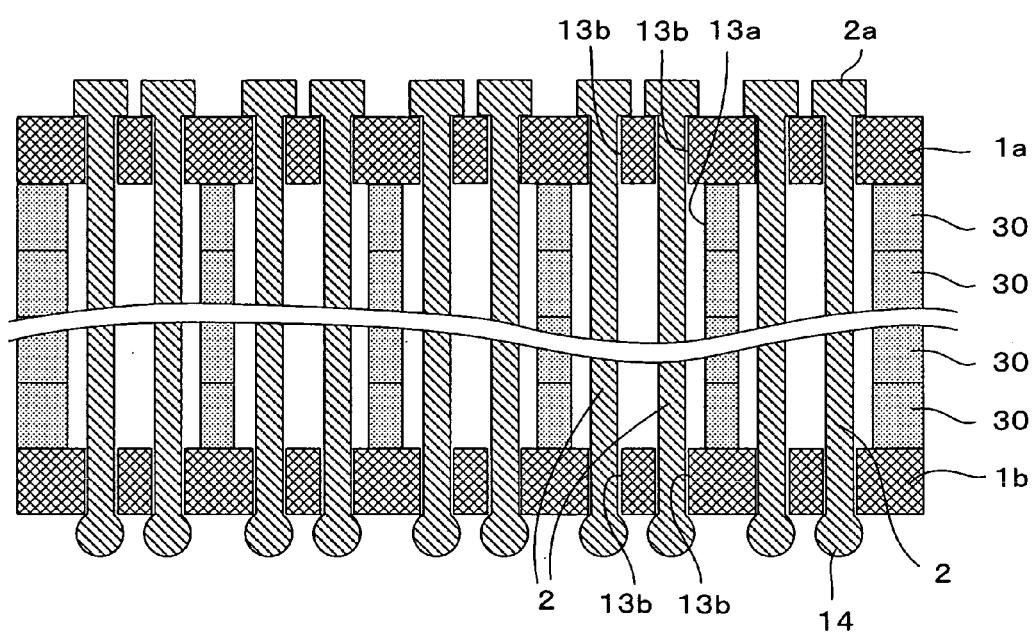
FIG. 8 illustrates a method of manufacturing a glass substrate according to an embodiment of the invention showing a glass via-hole formation process.

In addition, while the wires 2 are penetrated by matching the via-holes 13b formed in the upper and lower bases 1a and 1b with the via-holes 13a formed in the panel-shaped glass 30 in a one-to-one relationship in the first embodiment, the invention is not limited thereto. FIG. 8 illustrates a condition in which a plurality of panel-shaped glass pieces 30 are stacked and interposed between the upper and lower bases 1a and 1b, the wires 2 are penetrated into each via-hole 13, and the wires 2 are secured in the upper and lower bases 1a and 1b. An individual via-hole 13a formed in each panel-shaped glass piece 30 matches two via-holes 13b formed in each of the upper and lower bases 1a and 1b. Therefore, two wires 2 are penetrated through a single via-hole 13a formed in each panel-shaped glass 30 by penetrating the wire 2 through each via-hole 13b formed in the upper and lower bases 1a and 1b. It is possible to form the through electrode 10 having a high hermetical sealing property by softening the panel-shaped glass 30 and allowing glass to flow in this state. In addition, the wires 2 can be tensioned by providing a jig 2a having a diameter larger than that of the via-hole 13b in one end of the wire 2, and providing a securing section 14 having a diameter larger than that of the via-hole 13b in the other end of the wire 2. In addition, the via-hole 13a of the panel-shaped glass 30 may be further enlarged such that a plurality of wires 2 can be penetrated.

Second Embodiment

FIGS. 9 to 12 are diagrams showing a method of manufacturing a glass substrate according to a second embodiment of the invention, and show a wire stretching process S3 in detail. First, in a base via-hole formation process S2, the via-holes 13b are formed in a panel-shaped upper base 1a and a concave lower base 1b. Other processes except for the base via-hole formation process S2 and the wire stretching process S3 are similar to those of the first embodiment, and description thereof will be omitted.

Figure 9:
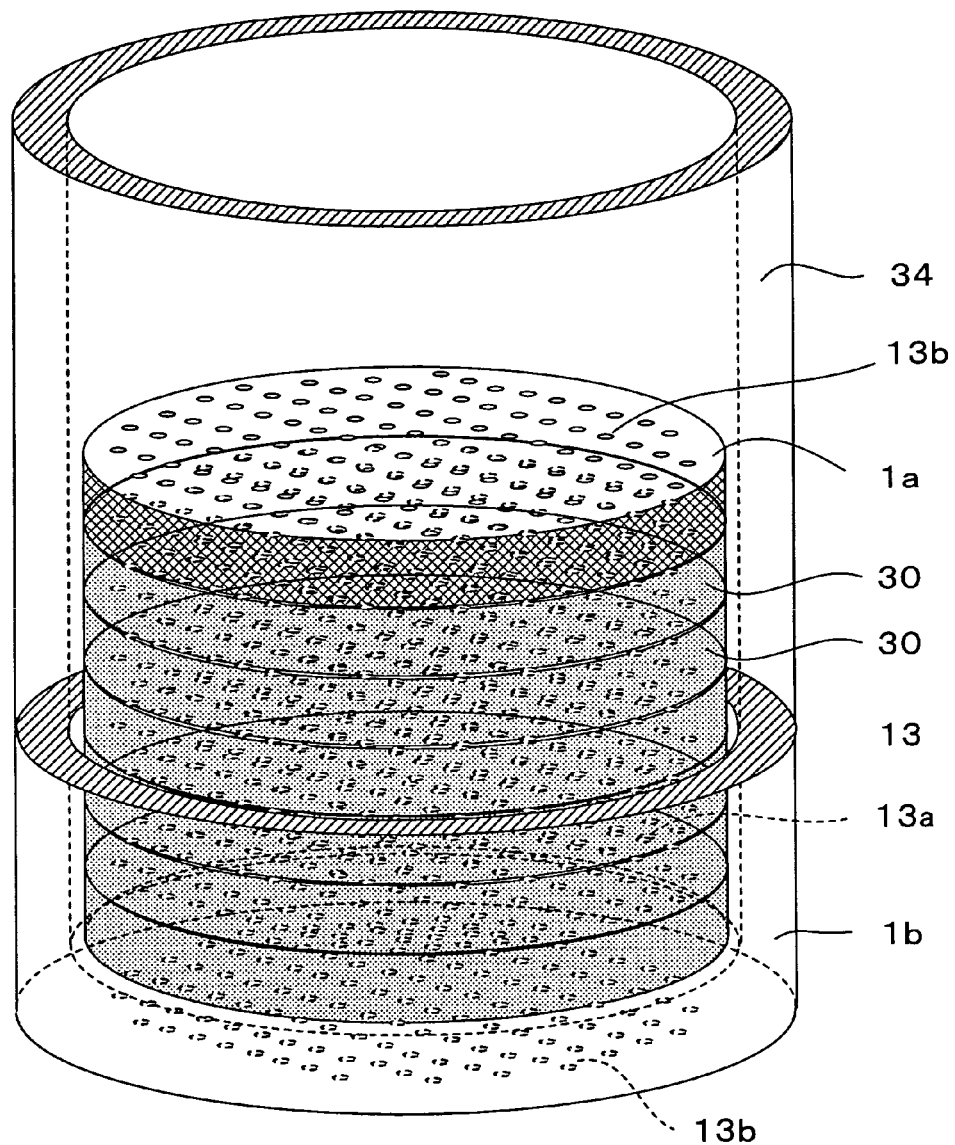
FIG. 9 illustrates a method of manufacturing a glass substrate according to an embodiment of the invention showing a wire stretching process.

FIG. 9 illustrates a condition in which a plurality of panel-shaped glass pieces 30 having a plurality of via-holes 13a are stacked between the panel-shaped upper base 1a and the concave lower base 1b having a plurality of via-holes 13b. A cylinder 34 having the same cylindrical shape as the lower base 1b is provided on the top surface of the cylindrical lower base 1b and used as a guide for the panel-shaped glass pieces 30 and the upper base 1a. The cylinder 34 is provided to be sufficiently higher than the upper base 1a. The positions of the via-holes 13b formed in the upper and lower bases 1a and 1b and the via-holes 13a formed in the panel-shaped glass piece 30 are aligned and fixed. The upper and lower bases 1a and 1b and the cylinder 34 may be made of a carbon material or a ceramic material. The via-holes 13b may be punctured using drilling or the like. In addition, the via-holes may be previously formed in a green sheet and then sintered, so that the green sheet can be used as the base having the via-holes. While the upper and lower bases 1a and 1b have a disc shape or a cylindrical shape, the upper and lower bases 1a and 1b may have a rectangular shape without limitation.

Figure 10:
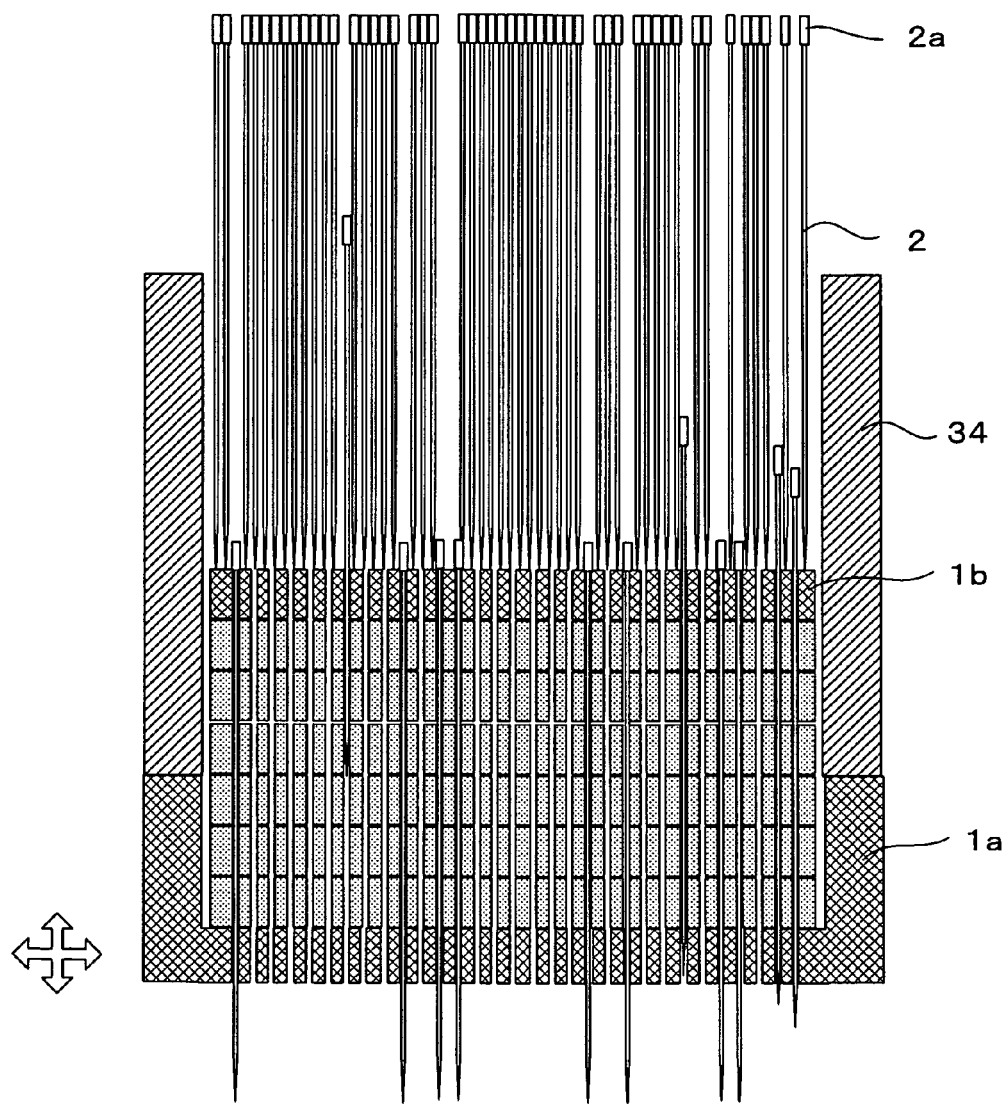
FIG. 10 illustrates a method of manufacturing a glass substrate according to an embodiment of the invention showing a wire stretching process.

FIG. 10 illustrates a wire installation process in which a plurality of panel-shaped glass pieces 30 are stacked and interposed between the upper and lower bases 1a and 1b, and the wires 2 are installed. First, the wires 2 are prepared such that one end is provided with a jig 2a having a diameter larger than that of the wire 2, and the other end is needle-shaped. The jig 2a has a diameter larger than that of the via-hole 13 provided in the upper and lower bases 1a and 1b, and the wire 2 has a diameter slightly smaller than that of the via-hole 13. Then, a plurality of wires 2 having the jigs 2a are vertically placed onto the upper base 1a housed in the cylinder 34 while the sharp leading ends are directed downward. In addition, the lower base 1a is placed in the vibration generator (not shown) and vibrated from right to left and up and down. As a result, the wires 2 can be placed and seated in a plurality of via-holes 13b of the upper base 1a and a plurality of via-holes 13a of the panel-shaped glass 30 while their positions are aligned within a short time.

Figure 11:
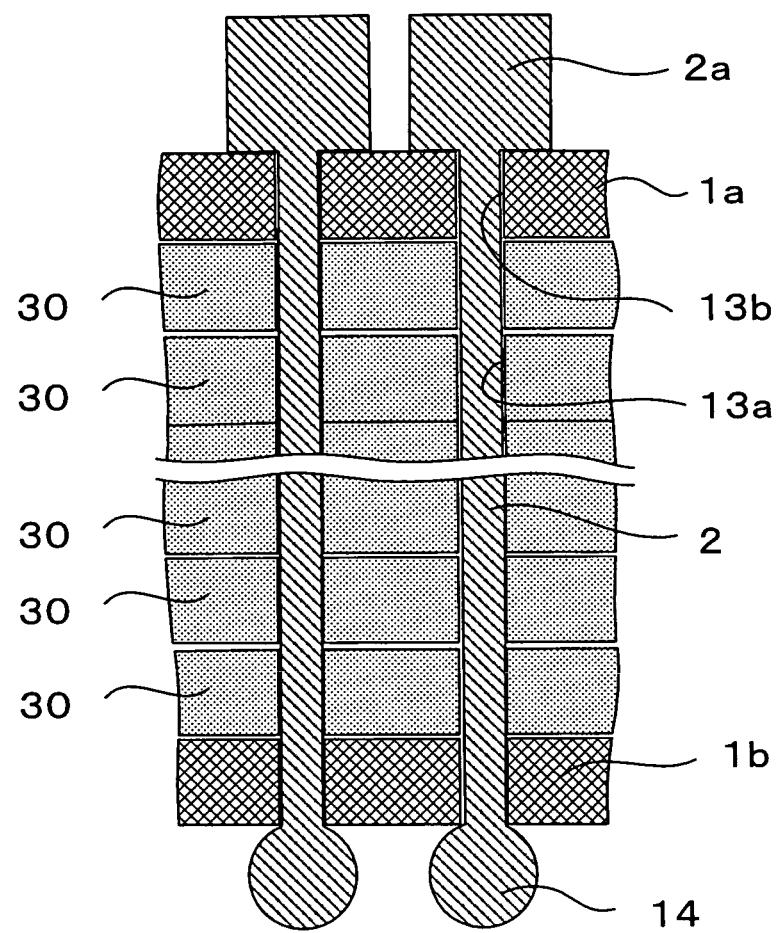
FIG. 11 illustrates a method of manufacturing a glass substrate according to an embodiment of the invention showing a wire stretching process.

FIG. 11 illustrates a securing section formation process in which the securing section 14 is formed in the leading end side of the wire 2 projected from the bottom surface of the lower base 1b. Since the diameter of the jig 2a is larger than that of the via-hole 13, it serves as a falling stopper. In addition, the securing section 14 having a diameter larger than that of the via-hole 13b is formed by melting the leading end of the wire 2 projected from the bottom surface of the lower base 1b. As a result, a plurality of wires 2 can be tensioned by applying a stress T in an expanding direction of the upper and lower bases 1a and 1b. Alternatively, since the securing section 14 may be used to secure the wire 2 in the lower base 1b, the securing section 14 may be formed to prevent the wire 2 from being removed out of the lower base 1b by tying or bending apart of the wire 2 projected to the bottom surface side from the lower base 1b instead of melting the leading end of the wire 2.

Figure 12:
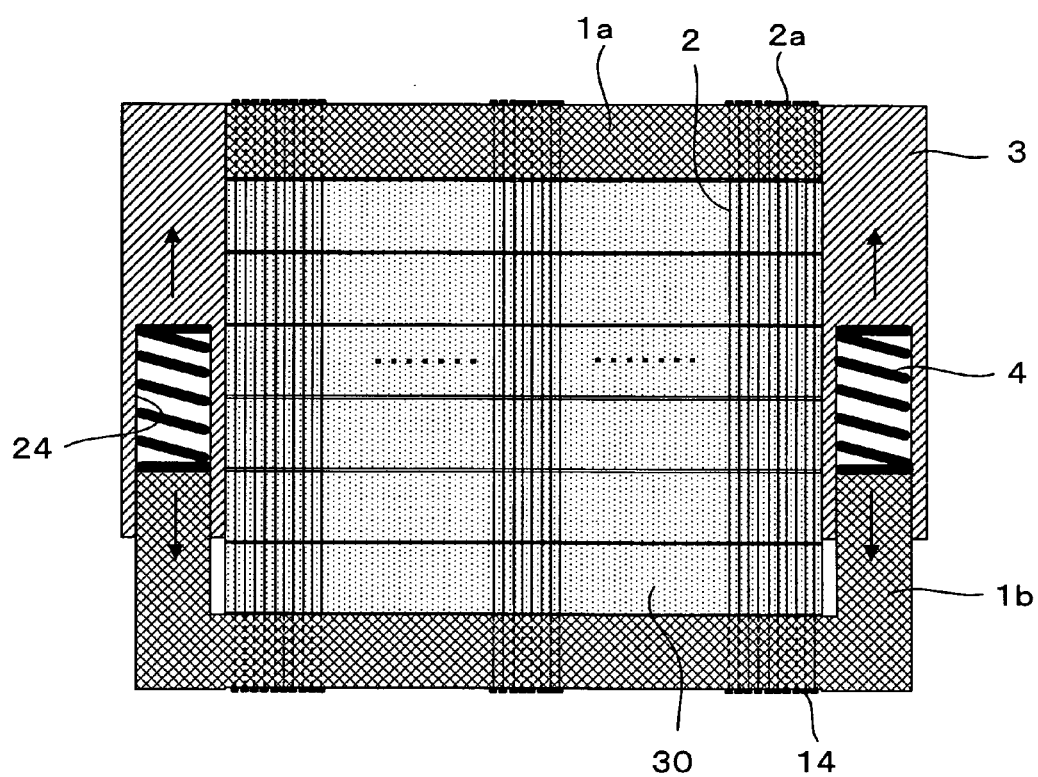
FIG. 12 illustrates a method of manufacturing a glass substrate according to an embodiment of the invention showing a wire stretching process.

FIG. 12 illustrates a tensioning process for tensioning the wires 2. First, the cylinder 34 is removed, and the tensioning member 3 is provided. That is, the tensioning member 3 is formed such that the outer circumference of the upper base 1a is fixed, and the cylindrical top portion of the lower base 1b can be housed. The tensioning member 3 biasing the upper and lower bases 1a and 1b to be separated away from each other is provided by integrating a spring member 4 with a housing 24. In addition, an opening is formed on the side surface of the tensioning member 3 in the vicinity of the upper base 1a to allow molten glass to be charged into the internal space obtained by the upper and lower bases 1a and 1b and the tensioning member 3. Alternatively, the internal space may be vacuumized. As a result, it is possible to prevent foams from being absorbed in the inner side of the glass.

Third Embodiment

Figure 13:
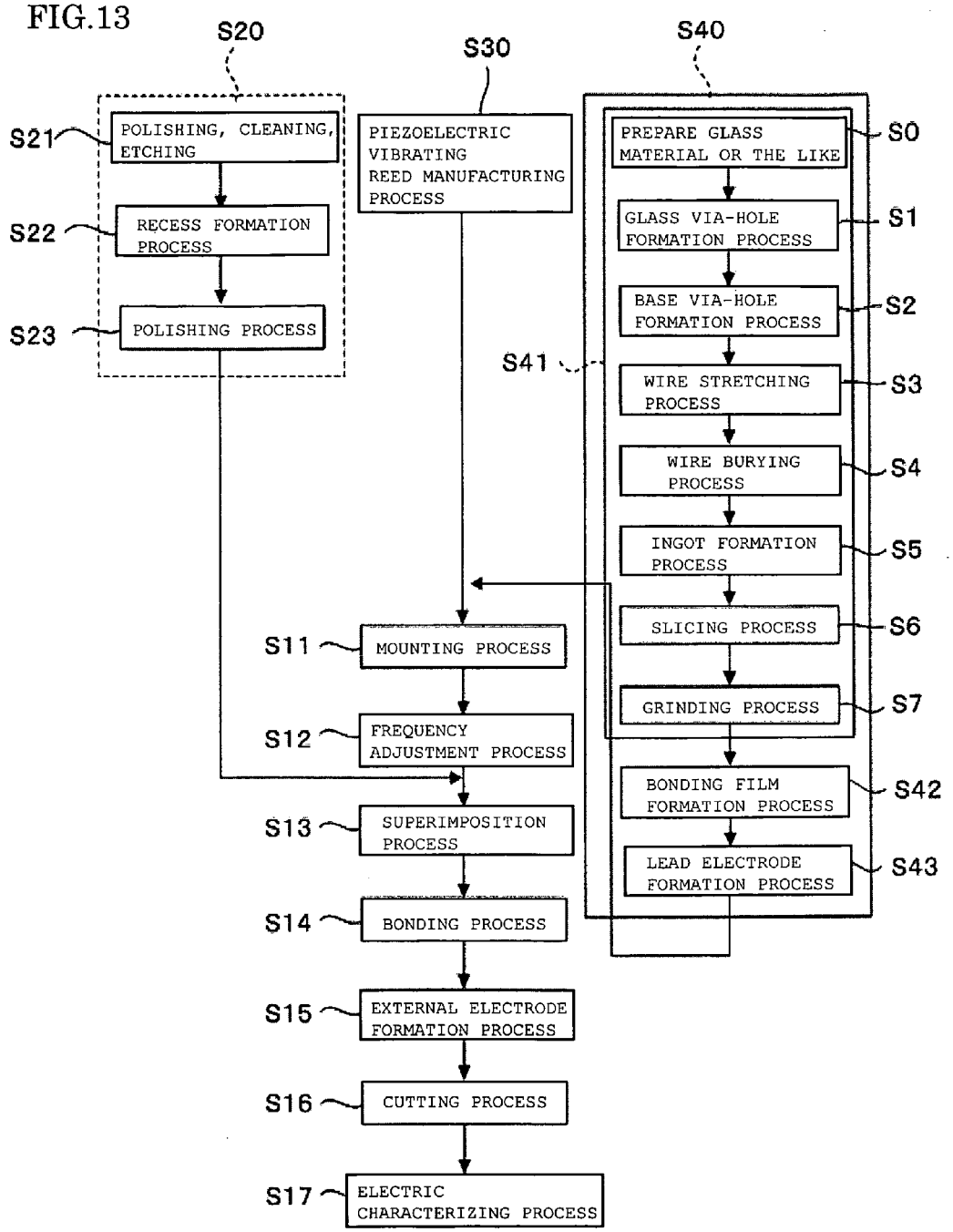
FIG. 13 is a flowchart illustrating a method of manufacturing an electronic component according to an embodiment of the invention.
Figure 14:
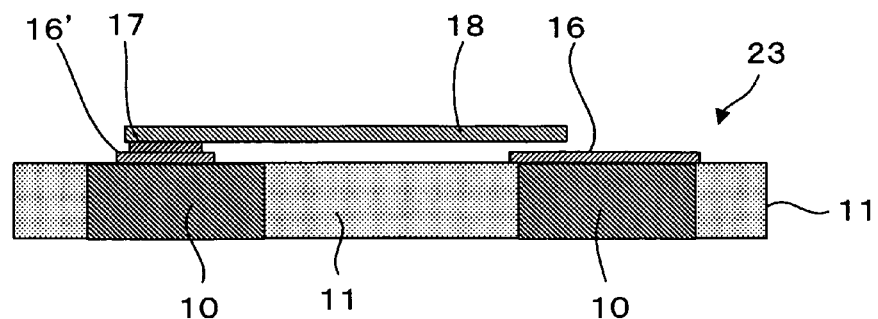
FIG. 14 is a schematic cross-sectional view illustrating a method of manufacturing an electronic component according to an embodiment of the invention showing a condition in which a piezoelectric vibrating reed is mounted.
Figure 15:
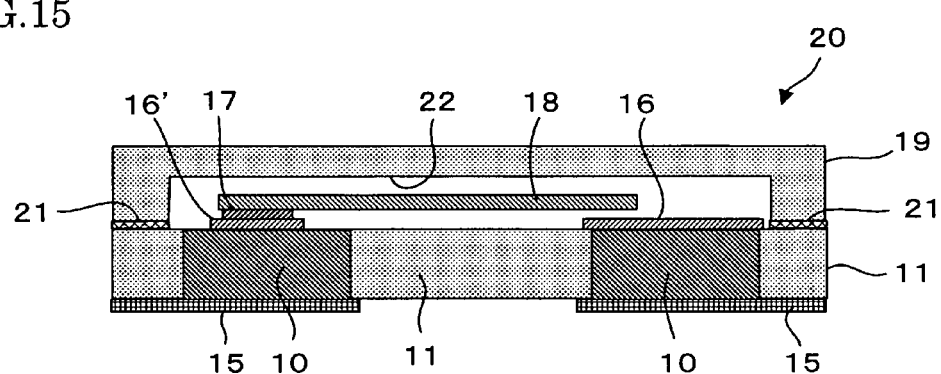
FIG. 15 illustrates a method of manufacturing an electronic component according to an embodiment of the invention showing a schematic cross-sectional view of a completed piezoelectric vibrator.

FIG. 13 is a flowchart illustrating a method of manufacturing an electronic component according to a third embodiment of the invention. FIG. 13 also shows an example in which a piezoelectric vibrator is used as an electronic component for mounting the glass substrate. FIG. 14 is a schematic cross-sectional view illustrating a condition in which a piezoelectric vibrating reed 18 is mounted on the glass substrate 11 having the through electrodes 10. FIG. 15 is a schematic cross-sectional view illustrating a completed piezoelectric vibrator 20. In the third embodiment, a base substrate formation process S40, a lid substrate formation process S20, and a piezoelectric vibrating reed formation process S30 are provided. Hereinafter, these processes are described in sequence.

First, in the glass material preparation process SO for preparing the glass material or the like, a glass material for forming the glass substrate 11, wires 2 for forming the through electrodes 10, and the like are prepared. In a glass via-hole formation process S1, a plurality of via-holes 13a are formed in the panel-shaped glass. In addition, in a base via-hole formation process S2, a plurality of via-holes 13b are formed in two bases 1a and 1b. Then, in a wire stretching process S3, the panel-shaped glass pieces 30 are stacked and interposed between the upper and lower bases 1a and 1b, positions of a plurality of the via-holes 13b of the upper and lower bases 1a and 1b and a plurality of the via-holes 13a of the panel-shaped glass 30 are aligned, wires 2 made of a conductive material are penetrated through a plurality of the via-holes 13, and the wires 2 are stretched between the upper and lower bases 1a and 1b. Then, in a wire burying process S4, the panel-shaped glass 30 is heated to a temperature equal to or higher than the softening point of the glass, and the wires 2 between the upper and lower bases 1a and 1b are buried by the panel-shaped glass 30. Then, in an ingot formation process S5, the glass is cooled, and the glass ingot 8 having the buried wires 2 is extracted. Then, in a slicing process S6, the glass ingot 8 is cut into round slices to form the glass panel 9. Then, in a grinding process S7, both surfaces of the extracted glass panel 9 are ground to expose the wires 2 on the front and rear surfaces as the through electrodes 10. This is the glass substrate formation process S41.

Then, in a bonding film formation process S42, a bonding film for positive electrode bonding is deposited on the area corresponding to the vicinity of the glass substrate 11. As the bonding film, an aluminum film is deposited. Then, in a lead electrode formation process S43, a lead electrode 16 is formed alongside the outer circumference of the glass substrate 11 from the top surface of one through electrode 10 to provide a base substrate 23. The lead electrodes 16 and 16' are formed by depositing an Au/Cr film using a sputtering method, and patterned by performing photolithography and etching. The lead electrodes 16 and 16' may be formed through a printing method or the like instead of the sputtering method. This is the base substrate formation process S40.

Next, a lid substrate formation process S20 will be described. The lid substrate 19 is preferably formed of the same material as that of the base substrate 23 in order to reduce a thermal expansion difference when the lid substrate 19 is bonded to the base substrate 23. When soda-lime glass is used in the base substrate 23, the lid substrate 19 is also formed of soda-lime glass. First, in the polishing, cleaning, and etching process S21, the glass substrate is polished and etched to remove a process-deformed layer on the outermost surface, and then, cleaned.

Then, in a recess formation process S22, the recess 22 is formed through press-molding. The recess 22 is molded by interposing the glass substrate between a receiving template having a convex ridge and a press template having a recess and heating and press-molding it at a temperature equal to or higher than a softening point of the glass. The molding template is preferably formed of a carbon material since it facilitates release of glass and provides excellent absorption of foams. Then, in a polishing process S23, the bonding surface to the base substrate 23 is polished to provide a flat surface. As a result, it is possible to improve a hermetical sealing property when bonded to the base substrate 23.

Then, in a piezoelectric vibrating reed formation process S30, a piezoelectric vibrating reed 18 made of a crystal panel is prepared. Excitation electrodes (not shown) electrically disconnected from each other are formed on both surfaces of the piezoelectric vibrating reed 18, and electrically connected to a terminal electrode formed on one end surface of the piezoelectric vibrating reed 18. Then, in amounting process S11, a conductive adhesive 17, for example, a gold bump is formed on the through electrode 10 of the base substrate 23 and the end portion of the lead electrode 16' or the terminal electrode of the piezoelectric vibrating reed 18. Using such a conductive adhesive 17, the piezoelectric vibrating reed 18 is mounted in a cantilever beam shape. As a result, the excitation electrodes formed on both surfaces of the piezoelectric vibrating reed 18 are electrically disconnected from each other and conductively connected to the two through electrodes 10.

Then, in a frequency adjustment process S12, a vibration frequency of the piezoelectric vibrating reed 18 is adjusted to a predetermined frequency. Then, in a superimposition process S13, the lid substrate 19 is placed on the base substrate 23 and superimposed using a bonding material 21. Then, in a bonding process S14, the base substrate 23 and the lid substrate 19 that are superimposed are heated, and a high voltage is applied between the base substrate 23 and the lid substrate 19 so as to be anodically bonded. Then, in an external electrode formation process S15, external electrodes 15 electrically connected to each of the through electrodes 10 are formed on the outer surface of the base substrate 23.

Then, in a cutting process S16, the glass substrate is cut alongside the cutting line to obtain individual piezoelectric vibrators 20.

In this manner, a plurality of wires 2 are stretched between the upper and lower bases 1a and 1b while the panel-shaped glass 30 is interposed therebetween. The panel-shaped glass 30 is heated to a temperature higher than the softening point of glass to fuse and bond the panel-shaped glass pieces 30 to each other or the panel-shaped glass 30 with the wires 2, and cooled to form the glass ingot 8, which is sliced and polished to manufacture the glass substrate 11. Using such a glass substrate 11, it is possible to form through electrodes 10 with a high hermetical sealing property and high positioning precision and provide excellent flatness. Therefore, it is possible to maintain a hermetical sealing property between the base substrate 23 and the lid substrate 19. As a result, it is possible to provide a piezoelectric vibrator 20 with high reliability. In addition, the external electrode 15 is formed in the external electrode formation process S15 according to the aforementioned embodiment may be previously formed in the glass substrate formation process S40. In addition, the frequency adjustment process S12 may be preceded by the cutting process S16.

Figure 16:
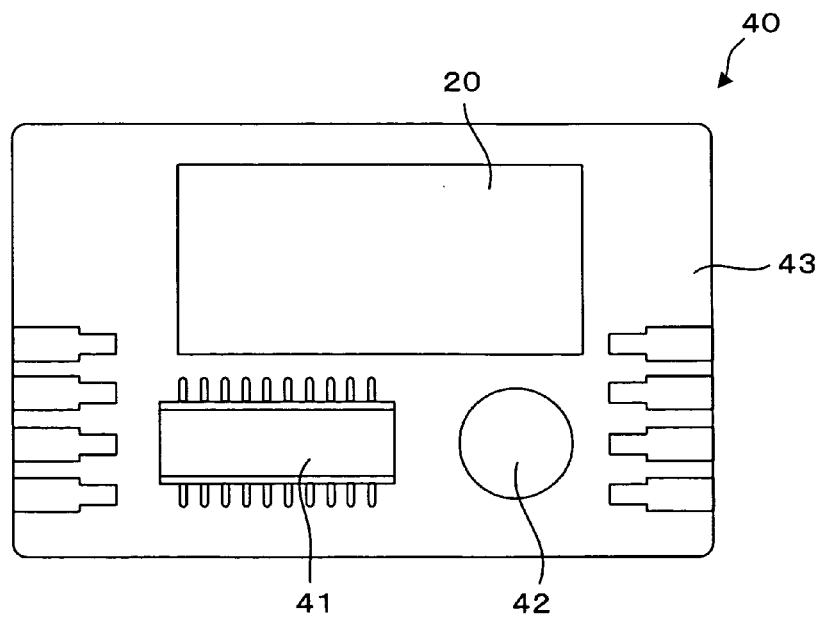
FIG. 16 is a top view illustrating a transmitter having a piezoelectric vibrator manufactured based on a method of manufacturing an electronic component according to an embodiment of the invention.
Figure 17A:
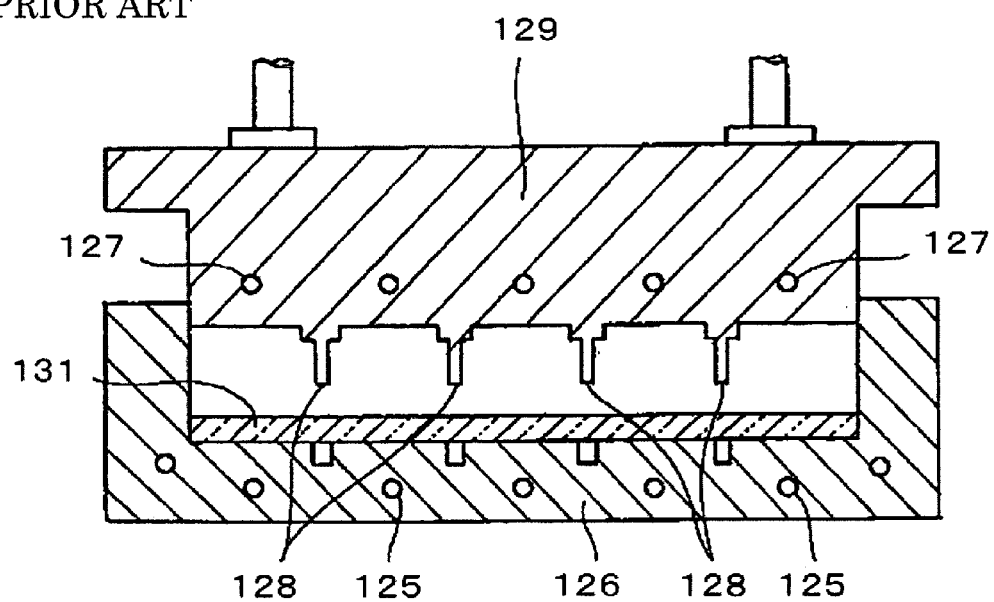
FIGS. 17A and 17B illustrate a method of forming via-holes in a glass panel and implanting pins in the related art.
Figure 17B:
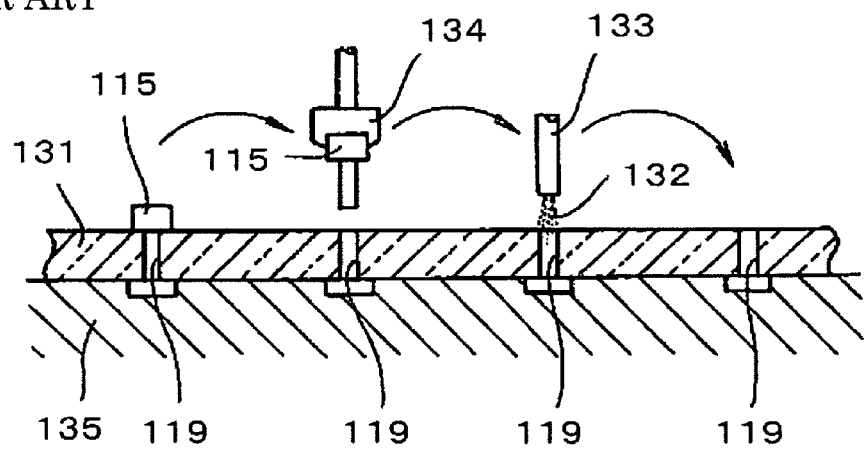
Figure 18A:
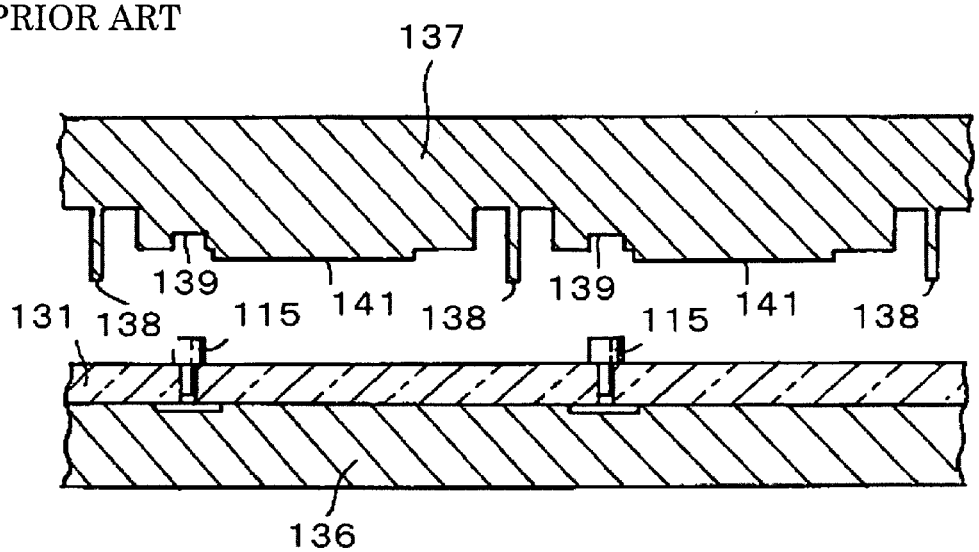
FIGS. 18A and 18B illustrate a condition in which a glass panel is shaped using a press-molding method in the related art.
Figure 18B:
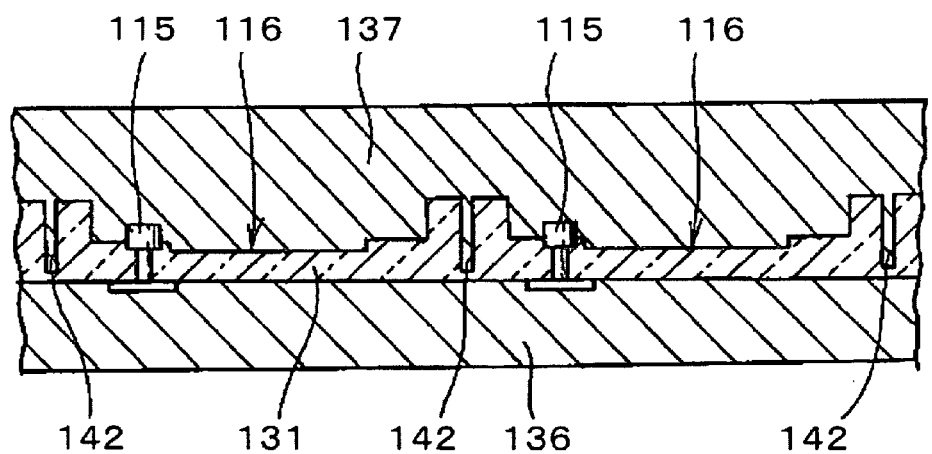

FIG. 16 is a schematic top view illustrating an oscillator 40 obtained by integrating the piezoelectric vibrator 20 manufactured through the manufacturing methods described in the third embodiment. As shown in FIG. 16, the oscillator 40 includes a board 43, a piezoelectric vibrator 20 provided on the board, an integrated circuit 41, and an electronic component 42. The piezoelectric vibrator 20 generates a predetermined frequency signal based on the driving signal applied to the external electrodes 6 and 7. The integrated circuit 41 and the electronic component 42 process the predetermined frequency signal supplied from the piezoelectric vibrator 20 to generate a reference signal such as a clock signal. Since the piezoelectric vibrator 20 according to an embodiment of the invention can be miniaturized with high reliability, the entire oscillator 40 can be configured more compactly.

What is claimed is:

1. A method of manufacturing a glass substrate with buried through electrodes, the method comprising:
   a glass via-hole formation process in which a plurality of via-holes are formed in a panel-shaped glass;
   a base via-hole formation process in which a plurality of via-holes are formed in two bases;
   a wire stretching process in which the panel-shaped glass is interposed between the two bases, positions of a plurality of the via-holes of the bases and a plurality of the via-holes of the panel-shaped glass are aligned with one another, a plurality of conductive wires each having a diameter smaller than that of each of the via-holes are penetrated through the plurality of the aligned via-holes using a jig that is provided at one end of each of the plurality of conductive wires and that has a diameter larger than that of each of the plurality of via-holes, and the plurality of the penetrated conductive wires are stretched between the two bases;
   a wire burying process in which the panel-shaped glass is heated to a temperature higher than a softening point of a glass material of the panel-shaped glass, a compression stress is applied to the panel-shaped glass, and the conductive wires stretched between the two bases are buried by the glass material;
   an ingot formation process in which a glass ingot having the buried conductive wires is formed by cooling the glass material;
   a slicing process in which a glass panel is formed by slicing the ingot; and
   a polishing process in which a plurality of the buried conductive wires are exposed on front and rear surfaces of the glass panel by polishing the glass panel to provide a glass substrate with buried through electrodes.

2. A method according to claim 1; wherein the glass via-hole formation process includes:
   a recess formation process in which a recess is formed in the panel-shaped glass; and
   a grinding process in which the recess is penetrated to a rear surface side of the panel-shaped glass by grinding an entire surface area of the rear surface opposite to a front surface where the recess is formed.

3. A method according to claim 2; wherein in the wire stretching process, a plurality of the conductive wires are stretched between the two bases by penetrating the plurality of the conductive wires through a single via-hole of the panel-shaped glass such that the plurality of the via-holes formed in the two bases are matched with a single via-hole formed in the panel-shaped glass.

4. A method according to claim 2; wherein in the ingot formation process, a cooling rate from a temperature 50° C. higher than the distortion point of the glass substrate to a temperature 50° C. lower than the distortion point thereof is configured to be slower than a cooling rate to a temperature 50° C. higher than the distortion point thereof.

5. A method according to claim 2; wherein each of the conductive wires has a thermal expansion coefficient substantially equal to that of the glass material.

6. A method according to claim 1; wherein in the wire stretching process, a plurality of the conductive wires are stretched between the two bases by penetrating a the plurality of the conductive wires through a single via-hole of the panel-shaped glass such that a the plurality of the via-holes formed in the two bases are matched with a single via-hole formed in the panel-shaped glass.

7. A method according to claim 6; wherein in the ingot formation process, a cooling rate from a temperature 50° C. higher than the distortion point of the glass substrate to a temperature 50° C. lower than the distortion point thereof is configured to be slower than a cooling rate to a temperature 50° C. higher than the distortion point thereof.

8. A method according to claim 6; wherein each of the conductive wires has a thermal expansion coefficient substantially equal to that of the glass material.

9. A method according to claim 1; wherein in the ingot formation process, a cooling rate from a temperature 50° C. higher than the distortion point of the glass substrate to a temperature 50° C. lower than the distortion point thereof is configured to be slower than a cooling rate to a temperature 50° C. higher than the distortion point thereof.

10. A method according to claim 9; wherein each of the conductive wires has a thermal expansion coefficient substantially equal to that of the glass material.

11. A method according to claim 1; wherein each of the conductive wires has a thermal expansion coefficient substantially equal to that of the glass material.

12. A method according to claim claim 1; wherein in the wire stretching process, a plurality of the conductive wires are stretched between the two bases by penetrating the plurality of the conductive wires through a single via-hole of the panel-shaped glass such that the plurality of the via-holes formed in the two bases are matched with a single via-hole formed in the panel-shaped glass.

13. A method according to claim 1; wherein in the ingot formation process, a cooling rate from a temperature 50° C. higher than the distortion point of the glass substrate to a temperature 50° C. lower than the distortion point thereof is configured to be slower than a cooling rate to a temperature 50° C. higher than the distortion point thereof.

14. A method according to claim claim 1; wherein each of the conductive wires has a thermal expansion coefficient substantially equal to that of the glass material.

15. A method of manufacturing a glass substrate with buried through electrodes, comprising:

forming a plurality of via-holes in each of a first panel made of a glass material and each of a pair of second panels;

interposing the first panel between the pair of second panels so that the via-holes formed in the first panel and in the second panels are aligned with one another;

penetrating through the aligned via-holes a plurality of conductive wires each having a diameter smaller than that of each of the via-holes using a jig that is provided at one end of each of the plurality of conductive wires and that has a diameter larger than that of each of the plurality of via-holes;

stretching between the second panels the conductive wires penetrated through the aligned via-holes;

applying compression stress to the first panel while heating the first panel to a temperature higher than a softening point of the glass material so that the stretched conductive wires are buried in the glass material;

cooling the compression stressed and heated first panel to form a glass ingot having the buried conductive wires;

slicing the glass ingot to form a glass panel; and polishing the glass panel to expose the buried conductive wires on front and rear surfaces of the glass panel to form a glass substrate with buried through electrodes.

16. A method according to claim 15; wherein the penetrating step comprises the step of penetrating the plurality of the conductive wires through a single via-hole of the first panel.

17. A method according to claim 16; wherein in the cooling step, a cooling rate from a temperature 50° C. higher than the distortion point of the glass substrate to a temperature 50° C. lower than the distortion point thereof is configured to be slower than a cooling rate to a temperature 50° C. higher than the distortion point thereof.

18. A method according to claim 17; wherein each of the conductive wires has a thermal expansion coefficient substantially equal to that of the glass material.

19. A method according to claim 15; wherein in the cooling step, a cooling rate from a temperature 50° C. higher than the distortion point of the glass substrate to a temperature 50° C. lower than the distortion point thereof is configured to be slower than a cooling rate to a temperature 50° C. higher than the distortion point thereof.

20. A method according to claim 15; wherein each of the conductive wires has a thermal expansion coefficient substantially equal to that of the glass material.

* * * * *